United States Patent
Chang et al.

(10) Patent No.: US 12,369,375 B2
(45) Date of Patent: Jul. 22, 2025

(54) GALLIUM NITRIDE TRANSISTOR

(71) Applicant: NATIONAL YANG MING CHIAO TUNG UNIVERSITY, Hsinchu (TW)

(72) Inventors: Edward Yi Chang, Hsinchu County (TW); Jui-Sheng Wu, Tainan (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 408 days.

(21) Appl. No.: 18/175,108

(22) Filed: Feb. 27, 2023

(65) Prior Publication Data
US 2024/0194742 A1 Jun. 13, 2024

(30) Foreign Application Priority Data
Dec. 12, 2022 (TW) .................. 111147525

(51) Int. Cl.
| H10D 62/85 | (2025.01) |
| H10D 30/69 | (2025.01) |
| H10D 64/27 | (2025.01) |
| H10D 64/68 | (2025.01) |

(52) U.S. Cl.
CPC ....... *H10D 62/8503* (2025.01); *H10D 30/701* (2025.01); *H10D 64/513* (2025.01); *H10D 64/685* (2025.01); *H10D 64/689* (2025.01); *H10D 64/691* (2025.01)

(58) Field of Classification Search
CPC ............. H10D 30/701; H10D 62/8503; H10D 64/513; H10D 64/685; H10D 64/689; H10D 64/691
See application file for complete search history.

(56) References Cited

U.S. PATENT DOCUMENTS

2019/0131382 A1* 5/2019 Lu .................... H10D 64/017

* cited by examiner

*Primary Examiner* — Daniel P Shook
(74) *Attorney, Agent, or Firm* — MUNCY, GEISSLER, OLDS & LOWE, P.C.

(57) ABSTRACT

A GaN transistor is provided, which comprises: a substrate; a GaN layer disposed on the substrate; a barrier layer disposed on the GaN layer; a source electrode disposed on the barrier layer; a drain electrode disposed on the barrier layer; a composite dielectric layer disposed on the barrier layer and comprising a first seed layer and a La-doped HZO layer, wherein the first seed layer comprises $ZrO_2$; and a gate electrode disposed on the composite dielectric layer.

17 Claims, 7 Drawing Sheets

GALLIUM NITRIDE TRANSISTOR

CROSS-REFERENCE TO RELATED APPLICATIONS

This application claims the benefits of the Taiwan Patent Application Serial Number 111147525, filed on Dec. 12, 2022, the subject matter of which is incorporated herein by reference.

BACKGROUND OF THE INVENTION

Field

The present invention provides a gallium nitride transistor. In particular, the present invention provides a gallium nitride transistor comprising a doped HZO layer and a $ZrO_2$ seed layer.

Description of Related Art

Doped $HfO_2$ ferroelectric (FE) thin films have proven to be promising materials in ferroelectric memory technology, and can be applied to ferroelectric random access memory (FRAM), ferroelectric field effect transistors (FeFET) and ferroelectric tunnel junctions (FTJs). Large trivalent dopants, such as lanthanides, are particularly suitable for increasing ferroelectricity (FE). Among them, La (lanthanum) is an effective and appropriate dopant to induce ferroelectricity of $HfO_2$ by increasing the formation tendency of the orthorhombic phase (o-phase) of the ferroelectric material. Therefore, in the case of hafnium zirconium oxide (HZO), a similar effect can be expected. However, after doping La, the overall electrical properties and crystallization of the La-doped HZO thin film increase, but the required annealing temperature also increases. Thus, La is also known as an amorphizer in $HfO_2$, so it may adversely affect crystallization if its concentration is not properly controlled.

In view of this, it is desirable to develop a novel ferroelectric structure, which can solve the problem of increasing annealing temperature of La-doped HZO thin films.

SUMMARY OF THE INVENTION

An object of the present invention is to provide a GaN transistor with excellent electrical properties.

The GaN transistor of the present invention comprises: a substrate; a GaN layer disposed on the substrate; a barrier layer disposed on the GaN layer; a source electrode disposed on the barrier layer; a drain electrode disposed on the barrier layer; a composite dielectric layer disposed on the barrier layer and comprising a first seed layer and a doped HZO layer, wherein the first seed layer comprises $ZrO_2$; and a gate electrode disposed on the composite dielectric layer.

The GaN transistor of the present invention comprises a composite dielectric layer, which is a laminated structure comprising a $ZrO_2$ seed layer and a doped HZO layer. When using the composite dielectric layer, the obtained GaN transistor has high threshold voltage, high current value, high gate anti-leakage property, stable ferroelectricity and/or long lifetime. Hence, the GaN transistor of the present invention is beneficial to the development of the application of enhanced GaN power components.

In one embodiment, the doping element in the doped HZO layer may be silicon (Si), aluminum (Al), yttrium (Y), lanthanum (La), gadolinium (Gd) or a combination thereof.

In one embodiment, the doped HZO layer in the GaN transistor may be a La-doped HZO layer.

In one embodiment, on the basis of the doped HZO layer (100 mol %), the doping element (for example, La) may be doped in an amount between 0.1 mol % and 2 mol %, preferably between 0.1 mol % and 1 mol %, and more preferably between 0.1 mol % and 0.7 mol %. In one embodiment of the present invention, the doping amount of La may be 0.4 mol %; but the present invention is not limited thereto, and the doping amount can be adjusted according to the needs.

In one embodiment, HZO in the doped HZO layer may be represented by the following formula (I):

$$Hf_xZr_{1-x}O_2 \qquad (I)$$

wherein, x may range between 0.3 and 0.9, and preferably between 0.4 and 0.6. In one embodiment of the present invention, x may be about 0.5; but the present invention is not limited thereto and x can be adjusted according to the needs.

In one embodiment, the thickness of the doped HZO layer may range between 5 nm and 20 nm, preferably between 5 nm and 15 nm, and more preferably between 5 nm and 10 nm. In one embodiment of the present invention, the thickness of the doped HZO layer may be about 8 nm; but the present invention is not limited thereto, and the thickness of the doped HZO layer can be adjusted according to the needs.

In one embodiment, the first seed layer may be disposed on any side of the doped HZO layer. For example, the first seed layer may be disposed on a side of the doped HZO layer facing the substrate or on a side opposite to the side of the doped HZO layer facing the substrate.

In one embodiment, the composite dielectric layer may further comprise a second seed layer, the doped HZO layer is disposed between the first seed layer and the second seed layer, and the second seed layer comprises $ZrO_2$.

In one embodiment, the first seed layer and/or the second seed layer may respectively a $ZrO_2$ layer. In one embodiment, the first seed layer and/or the second seed layer may respectively a $ZrO_2$ layer formed by atomic layer deposition (ALD). In one embodiment, the first seed layer and/or the second seed layer may respectively a $ZrO_2$ layer formed by plasma-enhanced atomic layer deposition (PEALD). By using the PEALD to form the seed layer, the plasma can provide additional energy to make the arrangement of the ferroelectric structure more uniform.

In one embodiment, the first seed layer and/or the second seed layer may respectively have a thickness ranging from 0.5 nm to 5 nm, preferably from 0.5 nm to 3 nm, and more preferably from 0.5 nm to 2 nm. In one embodiment of the present invention, the first seed layer and/or the second seed layer may respectively have the thickness of about 1 nm; but the present invention is not limited thereto, and the thickness of the first seed layer and/or the second seed layer can be adjusted according to the needs.

In one embodiment, the composite dielectric layer may comprise a plurality of doped HZO layers, for example, two, three, four or five layers of doped HZO layers. When the composite dielectric layer comprises a plurality of doped HZO layers, both sides of at least one of the plurality of doped HZO layers may respectively be disposed with one seed layer. Herein, the materials and the thicknesses of the plurality of doped HZO layers and the plurality of seed layers are similar to those described above, and are not repeated here.

In one embodiment, the composite dielectric layer may further comprise a high bandgap blocking layer, and the high bandgap blocking layer is disposed between the barrier layer and the doped HZO layer. In one embodiment, the high bandgap blocking layer comprises $Al_2O_3$. In one embodiment, the thickness of the high bandgap blocking layer may range from 3 nm to 20 nm, preferably from 3 nm to 15 nm, and more preferably from 5 nm to 13 nm. In one embodiment of the present invention, the thickness of the high bandgap blocking layer may be about 10 nm; but the present invention is not limited thereto, and the thickness of the high bandgap blocking layer can be adjusted according to the needs.

In one embodiment, the composite dielectric layer may further comprise a charge trapping layer, and the charge trapping layer is disposed between the barrier layer and the doped HZO layer. In one embodiment, the charge trapping layer may comprise HfON. In one embodiment, the thickness of the charge trapping layer may range from 3 nm to 20 nm, preferably from 3 nm to 15 nm, and more preferably from 5 nm to 13 nm. In one embodiment of the present invention, the thickness of the charge trapping layer may be about 6 nm; but the present invention is not limited thereto, and the thickness of the charge trapping layer can be adjusted according to the needs.

In one embodiment, the composite dielectric layer may further comprise a high bandgap blocking layer and a charge trapping layer, wherein the high bandgap blocking layer is disposed on the barrier layer, the charge trapping layer is disposed on the high bandgap blocking layer, and the doped HZO layer is disposed on the charge trapping layer. Herein, the materials and the thicknesses of the high bandgap blocking layer and the charge trapping layer are similar to those described above, and are not repeated here.

In one embodiment, the substrate may be a quartz substrate, a glass substrate, a silicon wafer substrate, or a sapphire substrate. In one embodiment of the present invention, the substrate is a silicon wafer substrate.

In one embodiment, a nucleation layer may be selectively disposed between the substrate and the GaN layer to facilitate the growth of the sequentially formed GaN layer. The material of the nucleation layer may be AlN. In one embodiment, the thickness of the nucleation layer may range from 10 nm to 200 nm, preferably from 50 nm to 150 nm, and more preferably from 80 nm to 120 nm. In one embodiment, the thickness of the nucleation layer may be 100 nm; but the present invention is not limited thereto, and the thickness of the nucleation layer can be adjusted according to the needs.

In one embodiment, the thickness of the GaN layer may range from 1 μm to 20 μm, preferably from 1 μm to 15 μm, more preferably from 1 μm to 10 μm, and most preferably from 2 μm to 5 μm. In one embodiment of the present invention, the thickness of the GaN layer may be 4 μm; but the present invention is not limited thereto, and the thickness of the GaN layer can be adjusted according to the needs.

In one embodiment, the barrier layer may be an AlGaN layer. In one embodiment, the thickness of the barrier layer may range from 10 nm to 100 nm, preferably from 15 nm to 75 nm, and more preferably from 15 nm to 50 nm. In one embodiment of the present invention, the thickness of the barrier layer may be about 25 nm; but the present invention is not limited thereto, and the thickness of the barrier layer can be adjusted according to the needs.

In one embodiment, the GaN transistor may further comprise a passivation layer disposed on the barrier layer, wherein the composite dielectric layer is disposed on the passivation layer. In one embodiment, the passivation layer may comprise a hole, and the composite dielectric layer is disposed in the hole and contacts the barrier layer. In one embodiment, the material of the passivation layer may comprise silicon nitride. In one embodiment, the thickness of the passivation layer may range from 10 nm to 100 nm, preferably from 20 nm to 75 nm, and more preferably from 40 nm to 60 nm. In one embodiment of the present invention, the thickness of the passivation layer may be about 50 nm; but the present invention is not limited thereto, and the thickness of the passivation layer can be adjusted according to the needs.

In one embodiment, the barrier layer may further comprise a recess not penetrating through the barrier layer, the composite dielectric layer is further disposed in the recess, and the gate electrode is disposed correspondingly to the recess. More specifically, the hole of the passivation layer may correspond to the recess of the barrier layer; so the composite dielectric layer is further disposed in the hole and the recess, and the gate electrode is disposed correspondingly to the hole and the recess. When forming the recess in the barrier layer, the polarization of the AlGaN layer as the barrier layer can be reduced and the integrity of the channel can be maintained.

In one embodiment, the materials of the source electrode, the drain electrode and the gate electrode may respectively be copper (Cu), aluminum (Al), molybdenum (Mo), tungsten (W), gold (Au), chromium (Cr), nickel (Ni), platinum (Pt), titanium (Ti), copper alloy, aluminum alloy, molybdenum alloy, tungsten alloy, gold alloy, chromium alloy, nickel alloy, platinum alloy, titanium alloy, other suitable metals, or a combination thereof. In addition, the source electrode, the drain electrode, and the gate electrode may respectively be a single metal layer or multiple metal layers.

Other novel features of the present invention will become more apparent from the following detailed description when taken in conjunction with the accompanying drawings.

DETAILED DESCRIPTION OF THE INVENTION

Different embodiments of the present invention are provided in the following description. These embodiments are meant to explain the technical content of the present invention, but not meant to limit the scope of the invention. A feature described in an embodiment may be applied to other embodiments by suitable modification, substitution, combination, or separation.

It should be noted that, in the present specification, when a component is described to have an element, it means that the component may have one or more of the elements, and it does not mean that the component has only one of the element, except otherwise specified.

In the present specification, except otherwise specified, the feature A "or" or "and/or" the feature B means the existence of the feature A, the existence of the feature B, or the existence of both the features A and B. The feature A "and" the feature B means the existence of both the features A and B. The term "comprise(s)", "comprising", "include(s)", "including", "have", "has" and "having" means "comprise(s)/comprising but is/are/being not limited to".

In the present invention, except otherwise specified, the terms "almost", "about" and "approximately" usually mean the acceptable error in the specified value determined by a skilled person in the art, and the error depends on how the value is measured or determined. In some embodiments, the terms "almost", "about" and "approximately" mean within 1, 2, 3 or 4 standard deviations. In some embodiments, the terms "almost", "about" and "approximately" mean within ±20%, within ±15%, within ±10%, within ±9%, within ±8%, within ±7%, within ±6%, within ±5%, within ±4%, within ±3%, within ±2%, within ±1%, within ±0.5%, within ±0.05% or less of a given value or range. The quantity given here is an approximate quantity, that is, without specifying "almost", "about" and "approximately", it can still imply "almost", "about" and "approximately". In addition, the terms "in a range of a first value to a second value", "from a first value to a second value" and the like mean the said range comprises the first value, the second value and other values between the first value and the second value.

In addition, the features in different embodiments of the present invention can be mixed to form another embodiment.

Embodiment 1—Ferroelectric Capacitor Structure (Marked by HZLO/ZL in the Figure)

Figure 1:
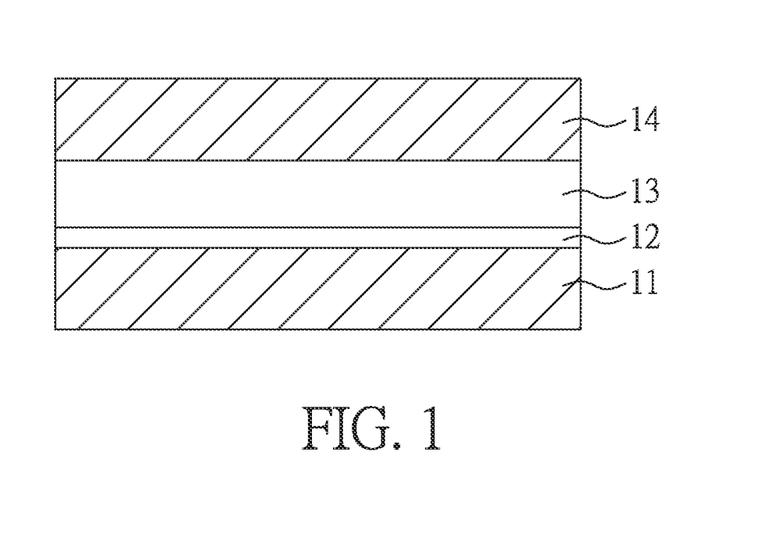
FIG. 1 is a schematic cross-sectional view of a ferroelectric capacitor structure according to Embodiment 1 of the present invention.

FIG. 1 is a schematic cross-sectional view of a ferroelectric capacitor structure of the present embodiment.

The method for preparing the ferroelectric capacitor structure of the present embodiment is briefly described below. Firstly, a TiN layer with a thickness of 100 nm was formed on a silicon substrate by sputtering. Next, a ZrO$_2$ layer with a thickness of 1 nm was grown by plasma-enhanced atomic layer deposition (PEALD), and then a La-doped HZO layer with a thickness of 9 nm was grown by atomic layer deposition (ALD). Finally, a TiN layer with a thickness of 50 nm was formed by sputtering to obtain the ferroelectric capacitor structure of the present embodiment.

As shown in FIG. 1, the ferroelectric capacitor structure of the present embodiment comprises: a first electrode 11; a second electrode 14 opposite to the first electrode 11; a doped HZO layer 13 layer disposed between the first electrode 11 and the second electrode 14; and a seed layer 12 disposed between the doped HZO layer 13 and the first electrode 11. Herein, the materials of the first electrode 11 and the second electrode 14 are TiN, and the thicknesses of the first electrode 11 and the second electrode 14 respectively are 100 nm and 50 nm. The seed layer 12 is a ZrO$_2$ layer formed by PEALD, and has a thickness of 1 nm. The doped HZO layer 13 is a La-doped HZO layer, and has a thickness of 9 nm, wherein HZO is Hf$_{0.5}$Zr$_{0.5}$O$_2$, and the doping amount of La is 0.4 mol %.

Comparative Embodiment 1—Ferroelectric Capacitor Structure (Marked by HZLO in the Figure)

The ferroelectric capacitor structure of the present comparative embodiment is similar to that of Embodiment 1, except that the ferroelectric capacitor structure of the present comparative embodiment does not comprise the seed layer 12 shown in FIG. 1.

Comparative Embodiment 2—Ferroelectric Capacitor Structure (Marked by HZO/SL in the Figure)

The ferroelectric capacitor structure of the present comparative embodiment is similar to that of Embodiment 1, except that the HZO layer without dopant is used in the ferroelectric capacitor structure of the present comparative embodiment.

Comparative Embodiment 3—Ferroelectric Capacitor Structure (Marked by HZO in the Figure)

The ferroelectric capacitor structure of the present comparative embodiment is similar to that of Embodiment 1, except that the ferroelectric capacitor structure of the present comparative embodiment does not comprise the seed layer 12 shown in FIG. 1 and the HZO layer without dopant is used in the ferroelectric capacitor structure of the present comparative embodiment.

Figure 2:
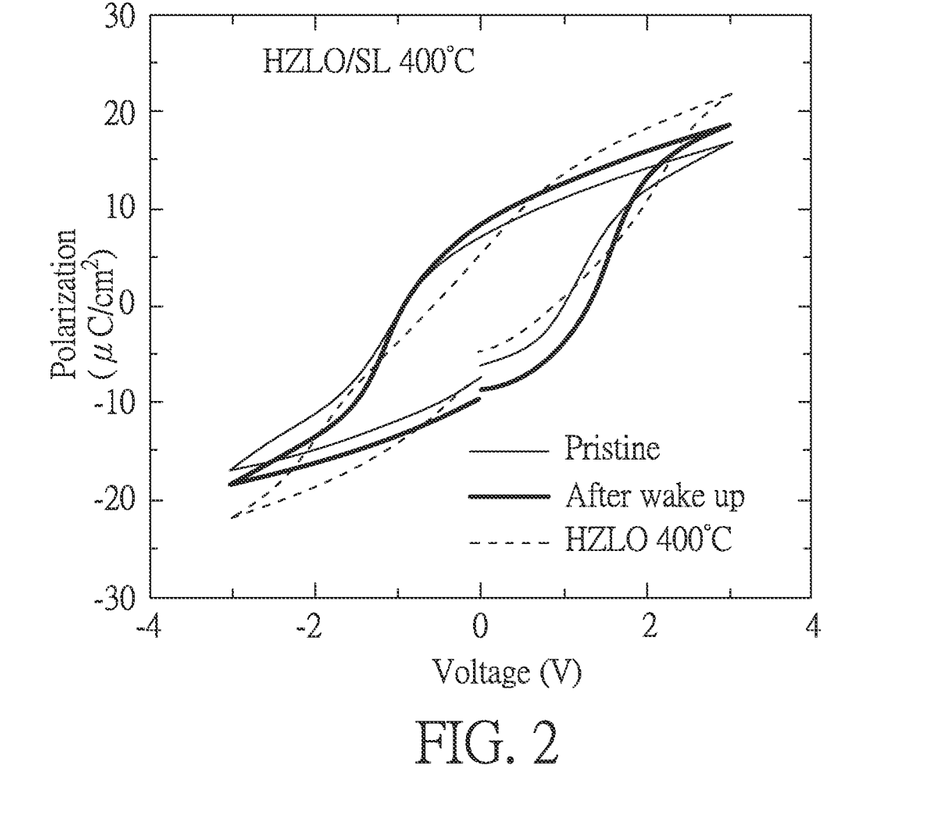
FIG. 2 is a graph showing the relationship between polarization and voltage of the ferroelectric capacitor structures of Embodiment 1 and Comparative embodiment 1 of the present invention.

FIG. 2 is a graph showing the relationship between polarization and voltage of the ferroelectric capacitor structures of Embodiment 1 and Comparative embodiment 1 of the present invention. Herein, the results were obtained through the switching experiment by using the ferroelectricity measurement device and calculating to obtain the polarization. In the figure, the curves labeled "pristine" and "after wake-up" respectively refer to the curves of the ferroelectric capacitor structure of Embodiment 1 annealed at 400° C. and measured before and after the wake-up process, wherein the "wake-up" process was performed by field cycling of 100 cycles, and each cycle was about 1 ms. The curve labeled "HZLO 400° C." refer to the curve of the ferroelectric capacitor structure of Comparative embodiment 1 annealed at 400° C. and measured after the wake-up process.

As shown in FIG. 2, after the ferroelectric capacitor structure of Embodiment 1 was annealed at 400° C., no matter at the pristine state or at the wake-up state, the ferroelectric capacitor structures of Embodiment 1 has higher remanent polarization compared with the ferroelectric capacitor structure of Comparative embodiment 1. In particular, even though no voltage is applied, the ferroelectric capacitor structure of Embodiment 1 annealed at 400° C. still has remanent polarization.

Figure 3:
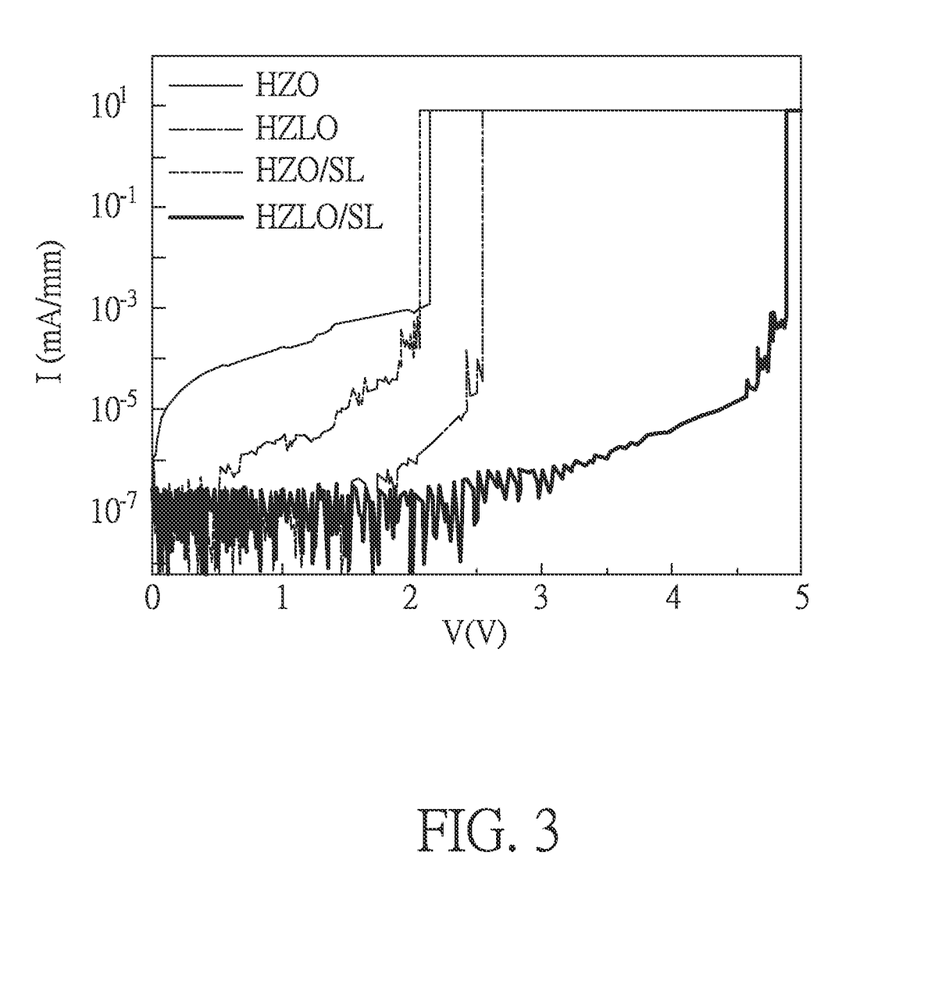
FIG. 3 is a graph showing the relationship between voltage and current of the ferroelectric capacitor structures of Embodiment 1 and Comparative embodiments 1 to 3 of the present invention.

FIG. 3 is a graph showing the relationship between voltage and current of the ferroelectric capacitor structures of Embodiment 1 and Comparative embodiments 1 to 3 of the present invention. Herein, a standard DC test was performed, one end of the ferroelectric capacitor structure was grounded, and the other end was given a voltage.

As shown in FIG. 3, after the ferroelectric capacitor structures of Embodiment 1 and Comparative embodiments 1 to 3 were annealed at 400° C., the anti-leakage property of the ferroelectric capacitor structure of Embodiment 1 is significantly higher than that of the ferroelectric capacitor structures of Comparative embodiments 1 to 3.

Figure 4:
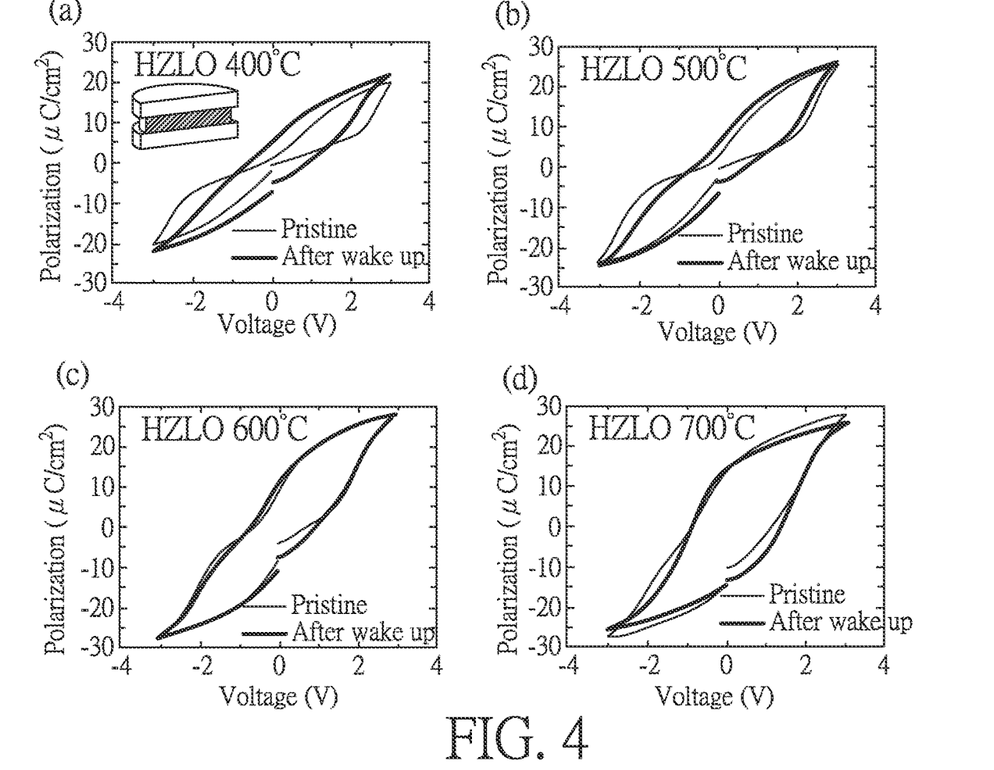
FIG. 4 shows graphs showing the relationship between polarization and voltage of the ferroelectric capacitor structure according to Comparative embodiment 1 of the present invention annealed at different temperatures.

FIG. 4 shows graphs showing the relationship between polarization and voltage of the ferroelectric capacitor structure according to Comparative embodiment 1 of the present invention annealed at different temperatures. In the figure, the curves labeled "pristine" and "after wake-up" respectively refer to the curves of the ferroelectric capacitor structure of Comparative embodiment 1 annealed at different temperatures and measured before and after the wake-up process.

The results shown in FIG. 4 indicate that the ferroelectric capacitor structure of Comparative embodiment 1 with the La-doped HZO layer exhibits remanent polarization only after annealing at least 600° C. (as shown in FIGS. 4 (c) and (d)). The results shown in FIG. 2 and FIG. 4 indicate that the ferroelectric capacitor structure of Embodiment 1 with the La-doped HZO layer and a $ZrO_2$ seed layer can exhibit remanent polarization even after low-temperature annealing (400° C.). The results shown in FIG. 2 and FIG. 4 indicate that the ferroelectric capacitor structure of Embodiment 1 with the La-doped HZO layer and a $ZrO_2$ seed layer can exhibit high anti-leakage property and high remanent polarization.

Figure 5:
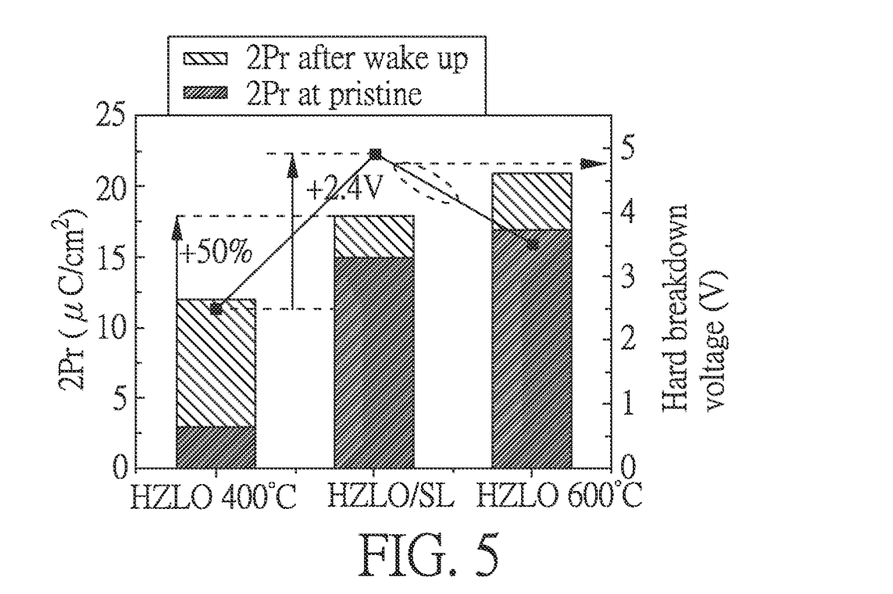
FIG. 5 is a graph showing the relationship between polarization and hard breakdown voltage of the ferroelectric capacitor structures of Embodiment 1 and Comparative embodiment 1 of the present invention.

FIG. 5 is a graph showing the relationship between polarization and hard breakdown voltage of the ferroelectric capacitor structures of Embodiment 1 and Comparative embodiment 1 of the present invention. In the figure, the bars labeled "HZLO 400° C." and "HZLO 600° C." respectively refer to the results of the ferroelectric capacitor structure of Comparative embodiment 1 annealed at 400° C. and 600° C. and measured at the pristine state (before the wake-up process) and the wake-up state. The bar labeled "HZLO/SL" refers to the result of the ferroelectric capacitor structure of Embodiment 1 annealed at 400° C. and measured at the pristine state (before the wake-up process) and the wake-up state.

As shown in FIG. 5, compared with the ferroelectric capacitor structure of Comparative embodiment 1 without the $ZrO_2$ seed layer and annealed at 400° C., the remnant polarization of the ferroelectric capacitor structure of Embodiment 1 with the $ZrO_2$ seed layer and annealed at 400° C. is increased by about 50%, and exhibits excellent anti-leakage property. In addition, the results shown in FIG. 5 indicate that the ferroelectric capacitor structure of Embodiment 1 with the $ZrO_2$ seed layer can reduce the thermal budget of the La-doped HZO material.

Figure 6:
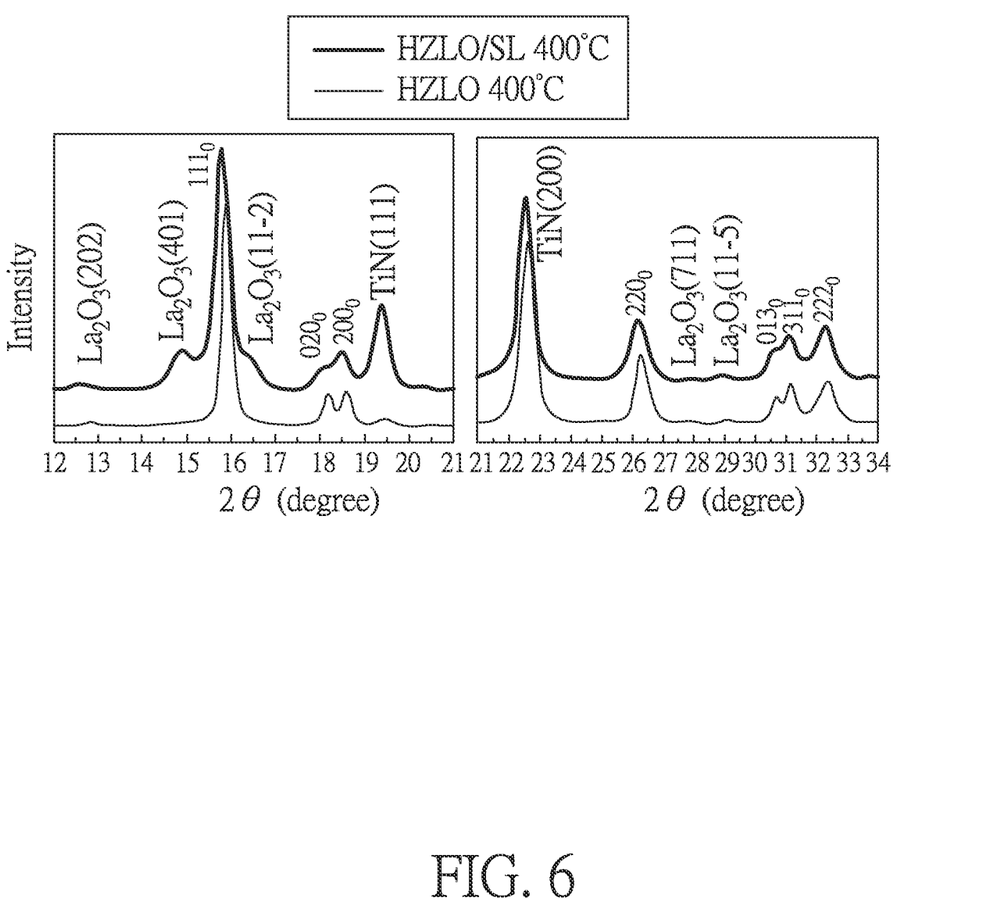
FIG. 6 shows In-plane GIXRD patterns of the ferroelectric capacitor structures of Embodiment 1 and Comparative embodiment 1 of the present invention after annealing at 400° C.

FIG. 6 shows In-plane GIXRD (grazing incidence X-ray diffraction) patterns of the ferroelectric capacitor structures of Embodiment 1 and Comparative embodiment 1 of the present invention after annealing at 400° C. Herein, the measurement was performed by using a GIXRD device, and a specific vertical angle was set.

The results shown in FIG. 6 indicate that compared with the ferroelectric capacitor structure of Comparative embodiment 1 without the $ZrO_2$ seed layer and annealed at 400° C., the ferroelectric capacitor structure of Embodiment 1 with the $ZrO_2$ seed layer and annealed at 400° C. has better crystallinity and crystallization of lanthanum oxide. This result verifies why the ferroelectric capacitor structure of Embodiment 1 has high anti-leakage property and high remanent polarization.

Embodiment 2—GaN Transistor

Figure 7A:
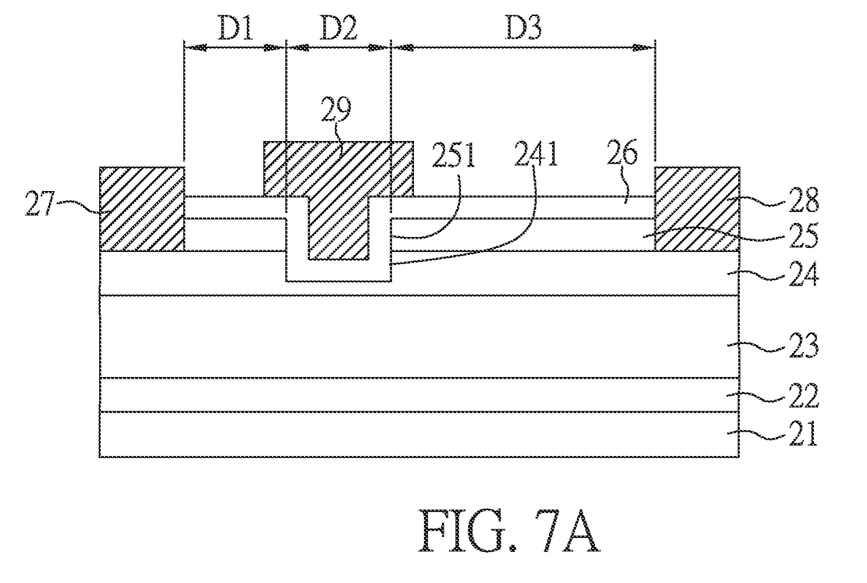
FIG. 7A is a schematic cross-sectional view of a GaN transistor according to Embodiment 2 of the present invention.
Figure 7B:
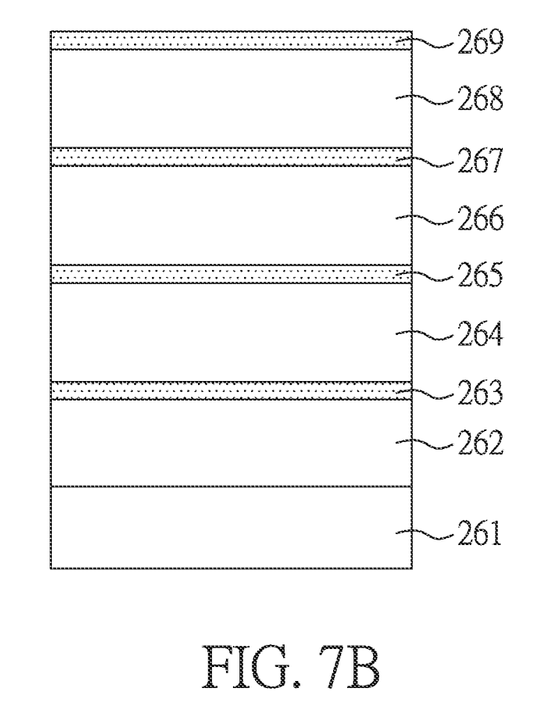
FIG. 7B is a schematic cross-sectional view of a part of a composite dielectric layer in the GaN transistor according to Embodiment 2 of the present invention.

FIG. 7A is a schematic cross-sectional view of a GaN transistor according to Embodiment 2 of the present invention. FIG. 7B is a schematic cross-sectional view of a part of a composite dielectric layer in the GaN transistor according to Embodiment 2 of the present invention.

Firstly, a silicon substrate was provided, and then an AlGaN/GaN heteroepitaxy structure was grown on the silicon substrate by metal organic chemical vapor deposition (MOCVD). The AlGaN/GaN heteroepitaxy structure was consisted of a 1-nm GaN cap layer, a 25-nm $Al_{0.23}Ga_{0.77}N$ barrier layer, a 4-μm undoped GaN layer and a 100-nm AlN nucleation layer. Next, the ohmic contacts comprising a source electrode and a drain electrode were formed by using the Ti/Al/Ni/Au metal stack. After in-situ nitrogen plasma treatment, a 50-nm $SiN_x$ passivation layer was formed by plasma-enhanced chemical vapor deposition (PECVD). A recess corresponding to the gate electrode was formed by nitride etching with the low power inductively coupled plasma (ICP), and the remaining thickness of the barrier layer at the recess after etching was about 3 nm. The composite dielectric layer comprising the ferroelectric materials was deposited by plasma-enhanced atomic layer deposition (PEALD), which comprised a high bandgap blocking layer (10-nm $Al_2O_3$), a charge trapping layer (6-nm HfON) and a ferroelectric laminated structure. The ferroelectric laminated structure comprised sequentially laminated plural 1-nm $ZrO_2$ seed layers and plural 8-nm La-doped HZO layers, La/(Hf+Zr) was 1/32, and Hf/Zr was 1/1. After annealing at 400° C. for 10 minutes, a Ni/Au metal stack was deposited by electron beam evaporation to form a gate electrode.

After the aforesaid process, the normally-off GaN transistor of the present embodiment can be obtained. As shown in FIG. 7A, the GaN transistor of the present embodiment comprises: a substrate 21 being a silicon substrate; a nucleation layer 22 disposed on the substrate 21, wherein the material of the nucleation layer 22 is AlN, and the thickness of the nucleation layer 22 is 100 nm; a GaN layer 23 disposed on the nucleation layer 22, wherein the thickness of the GaN layer 23 is 4 μm; a barrier layer 24 disposed on the GaN layer 23, wherein the material of the barrier layer 24 is AlGaN, and the thickness of the barrier layer 24 is 25 nm; a passivation layer 25 disposed on the barrier layer 24, wherein the material of the passivation layer 25 is $SiN_x$, and the thickness of the passivation layer 25 is 50 nm; a source electrode 27 disposed on the barrier layer 24; a drain electrode 28 disposed on the barrier layer 24; a composite dielectric layer 26 disposed on the barrier layer 24 and the passivation layer 25; and a gate electrode 29 disposed on the composite dielectric layer 26. The barrier layer 24 further comprises a recess 241, the passivation layer 25 comprises a hole 251, and the composite dielectric layer 26 is further disposed in the hole 251 and the recess 241 to contact the barrier layer 24. In addition, the gate electrode 29 is disposed correspondingly to the recess 241 of the barrier layer 24. The distance D1 between the source electrode 27 and the gate electrode 29 is 3 μm; the length D2 of the gate electrode 29 is 2 μm; the distance D3 between the source electrode 28 and the gate electrode 29 is 15 μm; and the width of the gate electrode 29 is 25 μm.

As shown in FIG. 7B, the composite dielectric layer of the GaN transistor of the present embodiment comprises: a high bandgap blocking layer 261 disposed on the barrier layer 24 and the passivation layer 25 shown in FIG. 7A, wherein the material of the high bandgap blocking layer 261 is $Al_2O_3$, and the thickness of the high bandgap blocking layer 261 is 10 nm; a charge trapping layer 262 disposed on the high bandgap blocking layer 261, wherein the material of the charge trapping layer 262 is HfON, and the thickness of the charge trapping layer 262 is 6 nm; plural seed layers 263, 265, 267, 269 and plural La-doped HZO layers 264, 266, 268 sequentially disposed on the charge trapping layer 262, wherein the material of each seed layer 263, 265, 267, 269 is $ZrO_2$, the thickness of each seed layer 263, 265, 267, 269 is 1 nm, and the thickness of each La-doped HZO layer 264, 266, 268 is 8 nm. In the present embodiment, the composite dielectric layer of the GaN transistor comprises plural seed layers 263, 265, 267, 269 and plural La-doped HZO layers 264, 266, 268, and one of the La-doped HZO layers 264, 266, 268 is disposed between two adjacent seed layers 263, 265, 267, 269. However, the present invention is not limited thereto, and the GaN transistor of the present invention may comprise one seed layer and one La-doped HZO layer.

Comparative Embodiment 4—GaN Transistor

The GaN transistor of the present comparative embodiment is similar to that of Embodiment 2, except that the material of the seed layers 263, 265, 267, 269 is $Al_2O_3$.

Figure 8A:
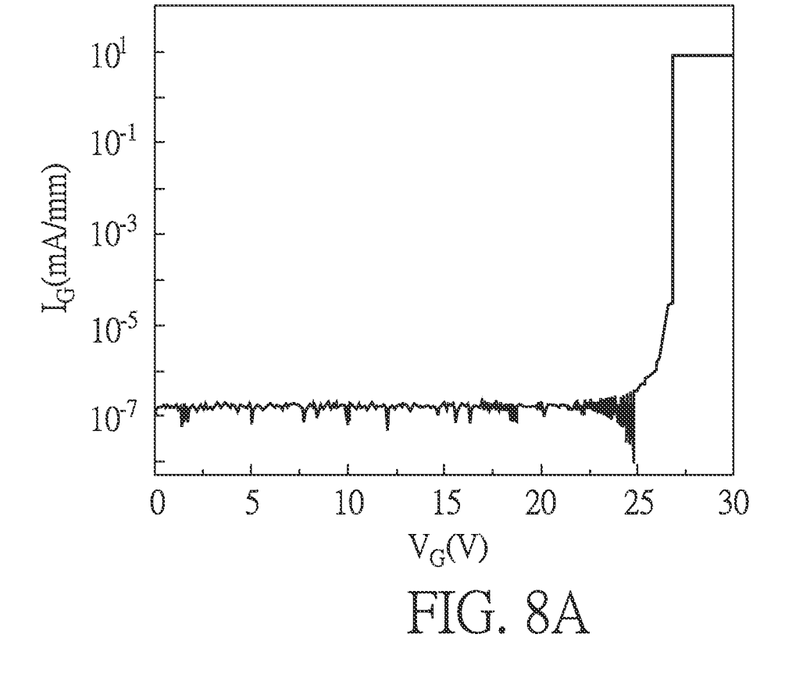
FIG. 8A is a graph showing the relationship between voltage and current of the GaN transistor according to Embodiment 2 of the present invention.
Figure 8B:
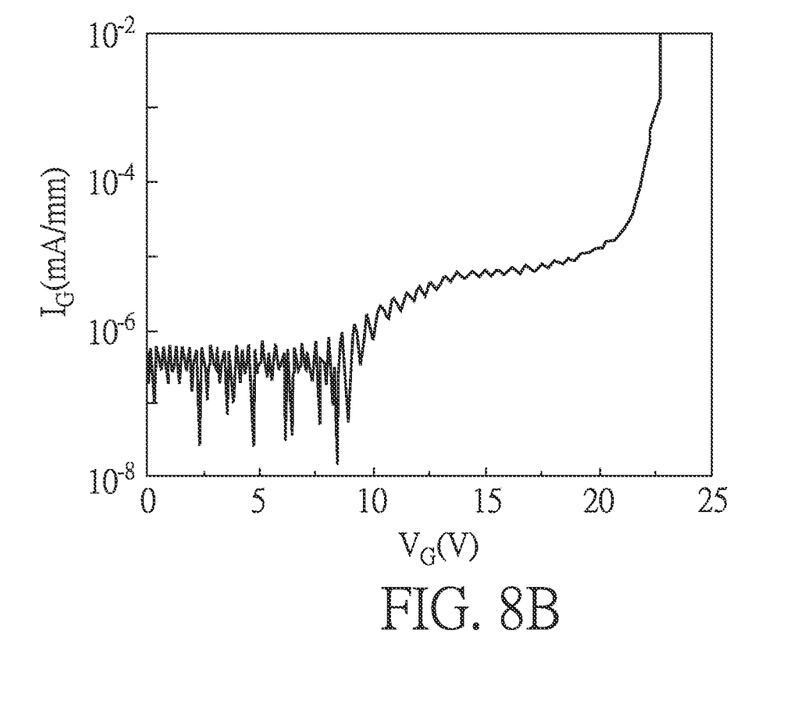
FIG. 8B is a graph showing the relationship between voltage and current of the GaN transistor according to Comparative embodiment 4 of the present invention.

FIG. 8A and FIG. 8B are respectively a graph showing the relationship between voltage and current of the GaN transistors according to Embodiment 2 and Comparative embodiment 4 of the present invention. Herein, the source electrode of the GaN transistor is grounded and the gate electrode is positively biased for measurement.

As shown in FIG. 8A, the GaN transistor of Embodiment 2 starts to generate leakage current at about 25 V. As shown in FIG. 8B, the GaN transistor of Comparative embodiment 4 starts to generate leakage current at about 10 V. These results indicate that the GaN transistor of Embodiment 2 with the La-doped HZO layer and the $ZrO_2$ seed layer exhibits significant anti-leakage property compared with the GaN transistor of Comparative embodiment 4.

Figure 9:
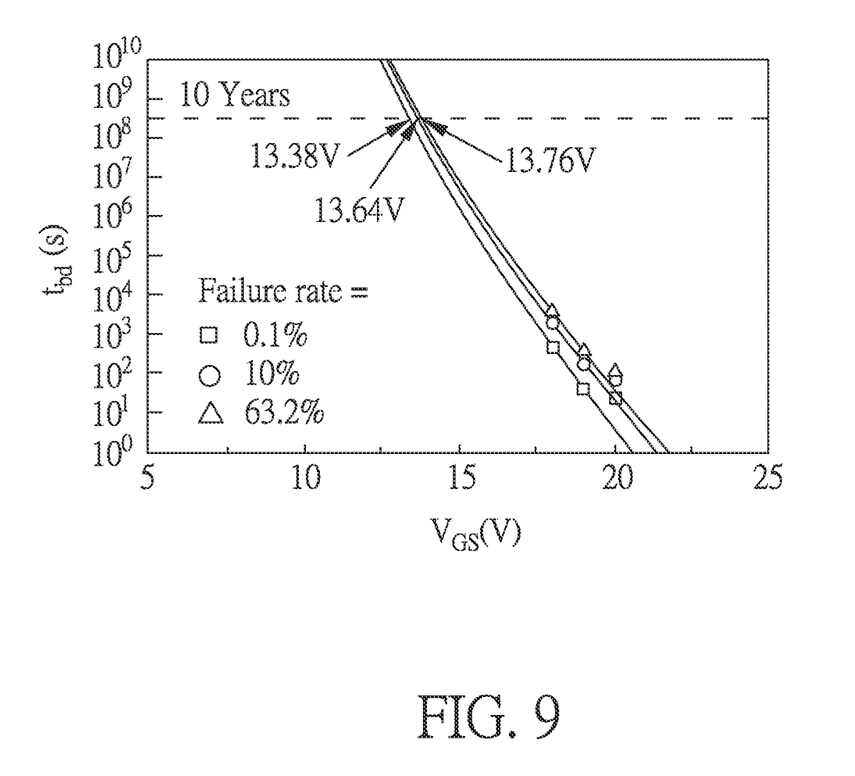
FIG. 9 is a graph showing the analysis results of the time-dependent dielectric breakdown reliability of the GaN transistor according to Embodiment 2 of the present invention.

FIG. 9 is a graph showing the analysis results of the time-dependent dielectric breakdown (DDB) reliability of the GaN transistor according to Embodiment 2 of the present invention, wherein the measurement method can be referred to "Long Term Stability of Enhancement Mode GaN Power Devices, Tian-Li WU, 2016". The result of the TDDB reliability indicates that the failure rates of the GaN transistor of Embodiment 2 are concentrated, and the voltage is about twice as high as that of the conventional p-GaN transistor.

In conclusion, the GaN transistor provided by the present invention has high threshold voltage and high current value by using the La-doped HZO layer and the $ZrO_2$ seed layer, and also has a high gate anti-leakage property and stable ferroelectricity at the same time. In addition, the result of the TDDB reliability also indicates that the GaN transistor provided by the present invention has long lifetime.

Although the present invention has been explained in relation to its embodiment, it is to be understood that many other possible modifications and variations can be made without departing from the spirit and scope of the invention as hereinafter claimed.

The invention claimed is:

1. A GaN transistor, comprising:
a substrate;
a GaN layer disposed on the substrate;
a barrier layer disposed on the GaN layer;
a source electrode disposed on the barrier layer;
a drain electrode disposed on the barrier layer;
a composite dielectric layer disposed on the barrier layer and comprising a first seed layer and a doped HZO layer, wherein the first seed layer comprises $ZrO_2$; and
a gate electrode disposed on the composite dielectric layer.

2. The GaN transistor of claim 1, wherein the doped HZO layer is a La-doped HZO layer.

3. The GaN transistor of claim 1, wherein the first seed layer is a $ZrO_2$ layer formed by plasma-enhanced atomic layer deposition (PEALD).

4. The GaN transistor of claim 1, wherein the first seed layer has a thickness ranging from 0.5 nm to 5 nm.

5. The GaN transistor of claim 1, wherein the composite dielectric layer further comprises a second seed layer, the doped HZO layer is disposed between the first seed layer and the second seed layer, and the second seed layer comprises $ZrO_2$.

6. The GaN transistor of claim 5, wherein the second seed layer is a $ZrO_2$ layer formed by plasma-enhanced atomic layer deposition (PEALD).

7. The GaN transistor of claim 5, wherein the second seed layer has a thickness ranging from 0.5 nm to 5 nm.

8. The GaN transistor of claim 1, wherein the barrier layer is an AlGaN layer.

9. The GaN transistor of claim 1, further comprising a passivation layer disposed on the barrier layer, wherein the composite dielectric layer is disposed on the passivation layer.

10. The GaN transistor of claim 9, wherein the passivation layer comprises a hole, and the composite dielectric layer is disposed in the hole and contacts the barrier layer.

11. The GaN transistor of claim 9, wherein the passivation layer comprises SiN.

12. The GaN transistor of claim 1, wherein the barrier layer further comprises a recess, the composite dielectric layer is disposed in the recess, and the gate electrode is disposed correspondingly to the recess.

13. The GaN transistor of claim 1, wherein the composite dielectric layer further comprises a high bandgap blocking layer, and the high bandgap blocking layer is disposed between the barrier layer and the doped HZO layer.

14. The GaN transistor of claim 13, wherein the high bandgap blocking layer comprises $Al_2O_3$.

15. The GaN transistor of claim 1, wherein the composite dielectric layer further comprises a charge trapping layer, and the charge trapping layer is disposed between the barrier layer and the doped HZO layer.

16. The GaN transistor of claim 15, wherein the charge trapping layer comprises HfON.

17. The GaN transistor of claim 1, wherein the doped HZO layer has a thickness ranging from 5 nm to 20 nm.

* * * * *